United States Patent
Iijima

(10) Patent No.: US 7,091,122 B2
(45) Date of Patent: Aug. 15, 2006

(54) SEMICONDUCTOR DEVICE AND METHOD OF MANUFACTURING THE SAME

(75) Inventor: Tadashi Iijima, Yorktown Hts, NY (US)

(73) Assignee: Kabushiki Kaisha Toshiba, Tokyo (JP)

( * ) Notice: Subject to any disclaimer, the term of this patent is extended or adjusted under 35 U.S.C. 154(b) by 157 days.

(21) Appl. No.: 10/920,387

(22) Filed: Aug. 18, 2004

(65) Prior Publication Data

US 2005/0054190 A1 Mar. 10, 2005

Related U.S. Application Data

(62) Division of application No. 10/347,237, filed on Jan. 21, 2003, now Pat. No. 6,831,368.

(30) Foreign Application Priority Data

Jan. 22, 2002 (JP) .............................. 2002-13438

(51) Int. Cl.
*H01L 21/44* (2006.01)

(52) U.S. Cl. ...................... 438/612; 438/622; 438/637; 438/675

(58) Field of Classification Search ................ 438/612, 438/613, 614, 622, 624, 637, 638, 642, 652, 438/672, 675
See application file for complete search history.

(56) References Cited

U.S. PATENT DOCUMENTS 5,700,735 A * 12/1997 Shiue et al. ................. 438/612
6,265,300 B1 * 7/2001 Bhansali et al. ............ 438/612
6,346,471 B1 * 2/2002 Okushima ................... 438/622
6,465,112 B1 10/2002 Ikura

FOREIGN PATENT DOCUMENTS

| JP | 53-56968 | 5/1978 |
|---|---|---|
| JP | 10-64938 | 3/1998 |
| JP | 11-162980 | 6/1999 |
| JP | 2000-299319 | 10/2000 |
| JP | 2000-340569 | 12/2000 |
| JP | 2001-267323 | 9/2001 |

OTHER PUBLICATIONS

Matsunaga et al.; "Wiring Structure of Semiconductor Device", U.S. Appl. No. 09/527,222, filed Mar. 16, 2000.
Decision of Rejection from Japanese Patent Office dated Jan. 4, 2005. and the English translation thereof.

* cited by examiner

*Primary Examiner*—Kevin M. Picardat
(74) *Attorney, Agent, or Firm*—Finnegan, Henderson, Farabow, Garrett & Dunner, L.L.P.

(57) ABSTRACT

Disclosed is a semiconductor device comprising a substrate, a first region provided on the substrate and comprising a first insulating portion which includes an insulating film having a relative dielectric constant of at most 3.0 and a conductive portion which is provided in the first insulating portion, a second region provided on the substrate, located adjacent to the first region in a direction parallel to a major surface of the substrate and comprising a second insulating portion which is located adjacent to the first insulating portion in the direction and which includes no insulating film having a relative dielectric constant of at most 3.0, and a pad provided on the second region and electrically connected to the conductive portion.

5 Claims, 3 Drawing Sheets

SEMICONDUCTOR DEVICE AND METHOD OF MANUFACTURING THE SAME

CROSS-REFERENCE TO RELATED APPLICATIONS

This is a divisional of application Ser. No. 10/347,237, filed on Jan. 21, 2003, now U.S. Pat. No. 6,831,368, which is based upon and claims the benefit of priority from Japanese Patent Application No. 2002-13438, filed on Jan. 22, 2002. The entire contents of these applications are incorporated herein by reference.

BACKGROUND OF THE INVENTION

1. Field of the Invention

The present invention relates to a semiconductor device and a method of manufacturing the same. More particularly, the invention relates to a technique of using a low dielectric-constant insulating film as an interlayer insulating film.

2. Description of the Related Art

It is proposed that insulating films having lower relative dielectric constants than ordinary $SiO_2$ films be used as interlayer insulating films in LSIs. The use of low dielectric-constant insulating films can lower inter-wiring capacitances, making it possible to enhance the operating speed of the LSI.

Most low dielectric-constant insulating films are, however, softer and more fragile than ordinary $SiO_2$ films. They are likely to be deformed, scratched or cracked. When used as interlayer insulating films in any LSI, too, they may be deformed or cracked when pads are connected to an external portion, inevitably decreasing the reliability or yield of the LSI. More specifically, they may be deformed or cracked when they receive a pressure as a test probe pressed onto the pads to evaluate the characteristics of LSI elements or as wire bonding is performed to connect the pads to an external portion.

To solve this problem, an insulating film made of ordinary $SiO_2$ may be formed in the peripheral region of a semiconductor chip, where the pads are provided, and a low dielectric-constant interlayer insulating film may be formed in the circuit region inside the peripheral region, where transistors, wires and the like are provided.

Pads are formed on the interlayer insulating films that lie, one above another, in the peripheral region of the chip. The pads formed on each interlayer insulating film are connected to the pads formed on the next interlayer insulating film by conductive portions (vias) that extend through the interlayer insulating film. To provide this structure, the following sequence of steps must be performed for each layer of the chip.

First, a low dielectric-constant insulating film is formed on the entire surface. Next, a peripheral part of the insulating film is removed. Then, an $SiO_2$ insulating film is formed in the removed region. Further, a via and a pad are formed. Obviously, many steps must be performed to manufacture the semiconductor device. This inevitably decreases the productivity.

As described above, low dielectric-constant interlayer insulating films are soft and fragile and likely to be deformed or cracked when pads are connected to the external portion. If deformed or cracked, they will degrade the reliability and characteristics of the device. To prevent the reliability and characteristics of the device from being degraded, it is proposed that an ordinary insulating film, such as $SiO_2$ film, be formed in only the peripheral region of the chip, where pads are provided. Since pads and conductive portions are formed at each layer, however, many steps must be performed to manufacture the semiconductor device. This inevitably decreases the efficiency of manufacturing the semiconductor device.

BRIEF SUMMARY OF THE INVENTION

According to a first aspect of the invention, there is provided a semiconductor device, comprising: a substrate; a first region provided on the substrate and comprising a first insulating portion which includes an insulating film having a relative dielectric constant of at most 3.0 and a conductive portion which is provided in the first insulating portion; a second region provided on the substrate, located adjacent to the first region in a direction parallel to a major surface of the substrate and comprising a second insulating portion which is located adjacent to the first insulating portion in the direction and which includes no insulating film having a relative dielectric constant of at most 3.0; and a pad provided on the second region and electrically connected to the conductive portion.

According to a second aspect of the invention, there is provided a method of manufacturing a semiconductor device, comprising: stacking a plurality of insulating films each having a relative dielectric constant of at most 3.0 in first and second regions which are provided on a substrate and which are located adjacent to each other in a direction parallel to a major surface of the substrate; removing those parts of the plurality of insulating films, which lie in the second region, to make a hole in the plurality of insulating films; forming an insulating film having a relative dielectric constant greater than 3.0 in the hole; and forming a pad above the insulating film having a relative dielectric constant greater than 3.0.

DETAILED DESCRIPTION OF THE INVENTION

An embodiment of the present invention will be described, with reference to the accompanying drawings.

FIGS. 1A to 1D are cross-sectional views that explain some of the steps of manufacturing a semiconductor device according to an embodiment of the present invention.

Figure 1A:
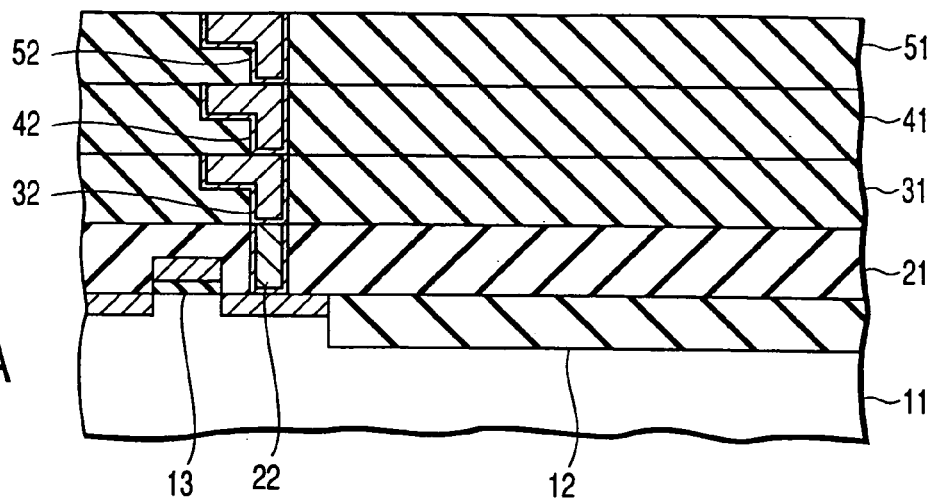
FIGS. 1A to 1D are cross-sectional views explaining some of the steps of manufacturing a semiconductor device according to an embodiment of the present invention.

As FIG. 1A shows, an isolation region 12, a MIS transistor 13 (active element), and the like are formed in a surface region of a semiconductor substrate 11. The MIS transistor 13 will be connected to a pad that will be described later. Then, an interlayer insulating film 21 is formed on the surface region of the substrate 11. The interlayer insulating film 21 is a silicon oxide film ($SiO_2$ film having a relative dielectric constant of, for example, 3.9). Thereafter, a part of the interlayer insulating film 21 is removed to make a through hole in the interlayer insulating film 21. Then, a stacked conductive film of a barrier metal film and a tungsten film is formed, filling up the through hole, thereby, a conductive connecting portion 22 connected to the source or drain of the MIS transistor 13 is formed.

An interlayer insulating film 31 is formed on the interlayer insulating film 21, covering the connecting portion 22, by means of CVD or a coating method. This interlayer insulating film 31 is a low dielectric-constant insulating film (Low-k insulating film) that has a relative dielectric constant of 3.0 or less. More specifically, the film 31 is made of, for example, poly methyl siloxane (MSX) or poly methyl silsesquioxane (MSQ). Then, a part of the interlayer insulating film 31 is removed to make a through hole in the interlayer insulating film 31. A stacked conductive film of a barrier metal film and a copper film is formed, filling up the through hole, thereby, a conductive connecting portion 32 connected to the conductive connecting portion 22 is formed. At the same time, wires (not shown) are formed.

Thereafter, an interlayer insulating film 41 and a conductive connecting portion 42, and an interlayer insulating film 51 and a conductive connecting portion 52 are formed by the same method and the same materials as described above. Nonetheless, the films 41 and 51 need not be made of the same method or formed of the same material, if they have a relative dielectric constant of 3.0 or less.

Figure 1B:
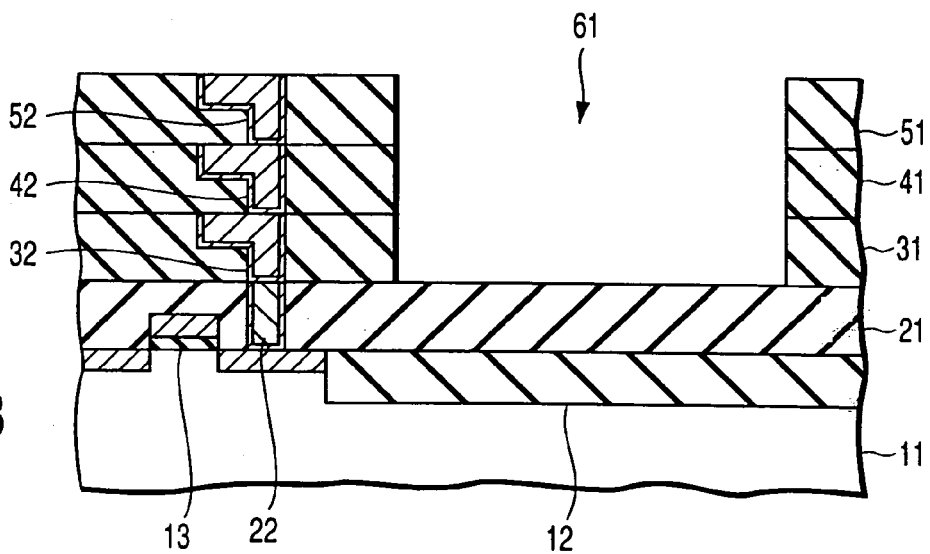

Next, as FIG. 1B shows, those parts of the interlayer insulating films 31, 41 and 51, which correspond to a region on which a pad is to be formed, are removed by ordinary photolithography and ordinary etching. The etching is, for example, anisotropic dry etching such as RIE. As a result, a hole 61 is made in the interlayer insulating films 31, 41 and 51. This hole has surfaces that are almost perpendicular to the major surface of the semiconductor substrate 11.

Figure 1C:
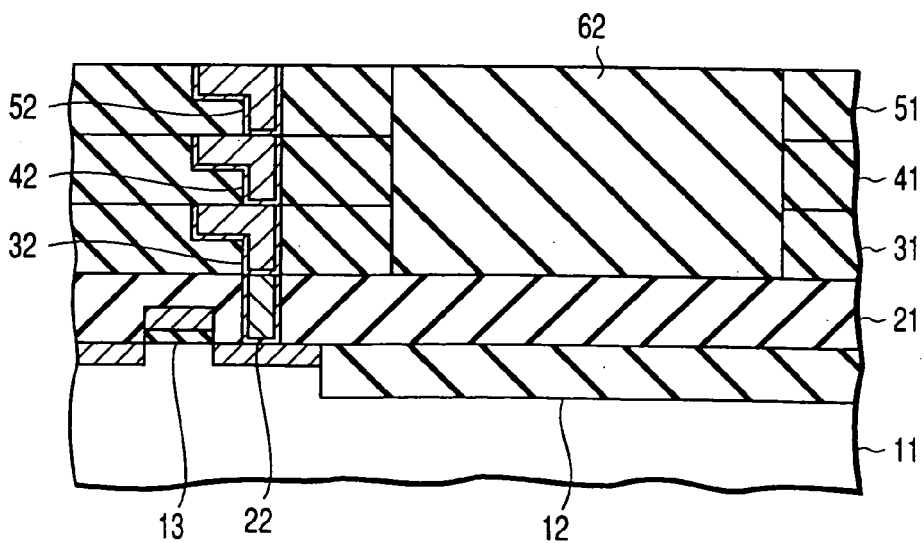

As FIG. 1C depicts, an $SiO_2$ film (e.g., one having a relative dielectric constant of 3.9) is formed by CVD on the upper surface of the resultant structure, filling the hole 61 made in interlayer insulating films 31, 41 and 51. The $SiO_2$ film is removed by CMP process or the like method, except that part formed in the hole 61. This part of the $SiO_2$ film serves as an insulating portion 62.

Figure 1D:
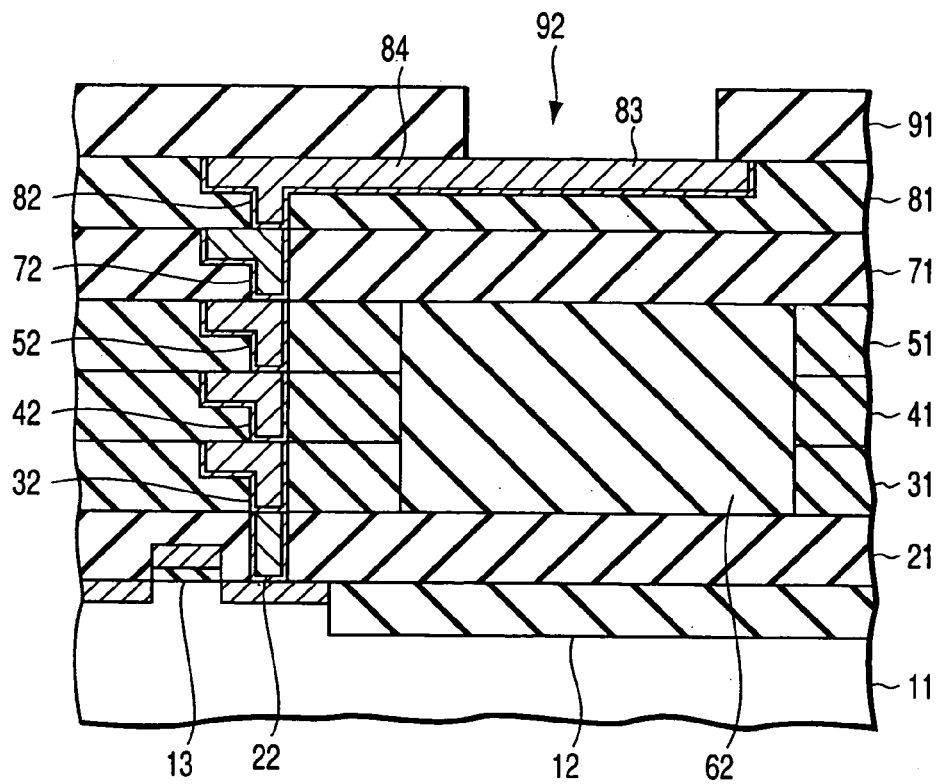

As FIG. 1D shows, an interlayer insulating film 71, such as $SiO_2$ film (having a relative dielectric constant of, for example, 3.9), is formed by CVD or the like method on the upper surface of the structure shown in FIG. 1C. Then, a part of the interlayer insulating film 71 is removed to make a through hole in the interlayer insulating film 71. A stacked conductive film of a barrier metal film and a copper film is formed, filling up the through hole, thereby, a conductive connecting portion 72 is formed.

An insulating film 81, such as $SiO_2$ film (having a relative dielectric constant of, for example, 3.9), is formed by CVD or the like method on the interlayer insulating film 71, covering the connecting portion 72. The insulating film 81 may be made of, for example, MSX, MSQ or the like that has a relative dielectric constant of 3.0 or less. A conductive connecting portion 82, a pad 83, and a connecting portion 84 that connect the portion 82 to the pad 83 are formed in the insulating film 81 by means of dual damascene process. More precisely, a hole and a trench are made in the insulating film 81 by removing a part of the insulating film 81. A barrier metal film and a seed layer (copper layer) are formed by sputtering, then a copper film is formed by plating. Further, excessive copper film and barrier metal film are removed by means of CMP, whereby a conductive connecting portion 82, a pad 83, and a connecting portion 84 are formed.

Thereafter, an insulating film 91, such as $SiO_2$ film, is formed on the insulating film 81, covering the connecting portion 82, pad 83 and connecting portion 84. That part of the insulating film 91, which lies on the pad 83, is removed, thus making a hole 92.

As a result, a semiconductor device of the structure shown in FIG. 1D is manufactured. The pad 83 is connected to an external portion when the evaluation of the device characteristics or the wire bonding process is carried out. Before the manufacture of the semiconductor device is completed, the pad 83 may be connected to a test probe to evaluate the electrical characteristics of the device element already fabricated. If the device element is found not to fulfill particular requirements, the unfinished device is considered faulty. In this case, subsequent manufacturing steps are not performed. Therefore, it is possible to avoid unnecessary subsequent steps.

In the embodiment described above, the conductive connecting portion 82, pad 83 and connecting portion 84 are formed by damascene process. Nonetheless, they may be formed by means of RIE, as will be described with reference to FIG. 2.

As in the embodiment described above, the insulating film 81, such as $SiO_2$ film (having a relative dielectric constant of, for example, 3.9), is formed by CVD or the like method on the interlayer insulating film 71, covering the connecting portion 72 formed in the film 71. The film 81 may be a low dielectric-constant insulating film made of MSX, MSQ or the like that has a relative dielectric constant of 3.0 or less. A hole is made in the insulating film 81 by removing a part of the insulating film 81. Then, a barrier metal film and an aluminum film (or a film made of mainly aluminum) are formed. The barrier metal film and the aluminum film are patterned by means of RIE, thus forming conductive connecting portion 82, pad 83 and connecting portion 84. Thereafter, an insulating film 91 such as an $SiO_2$ film is formed on the entire surface, and that part of the insulating film 91, which lie on the pad 83, is removed, thus making a hole 92. As a result, a semiconductor device of the structure shown in FIG. 2 is manufactured.

In the embodiment described above, the insulating film 21 is provided beneath the insulating portion 62, and the insulating film 71 on the insulating portion 62. The insulating films 21 and 71 may not be used in the embodiment.

Figure 2:
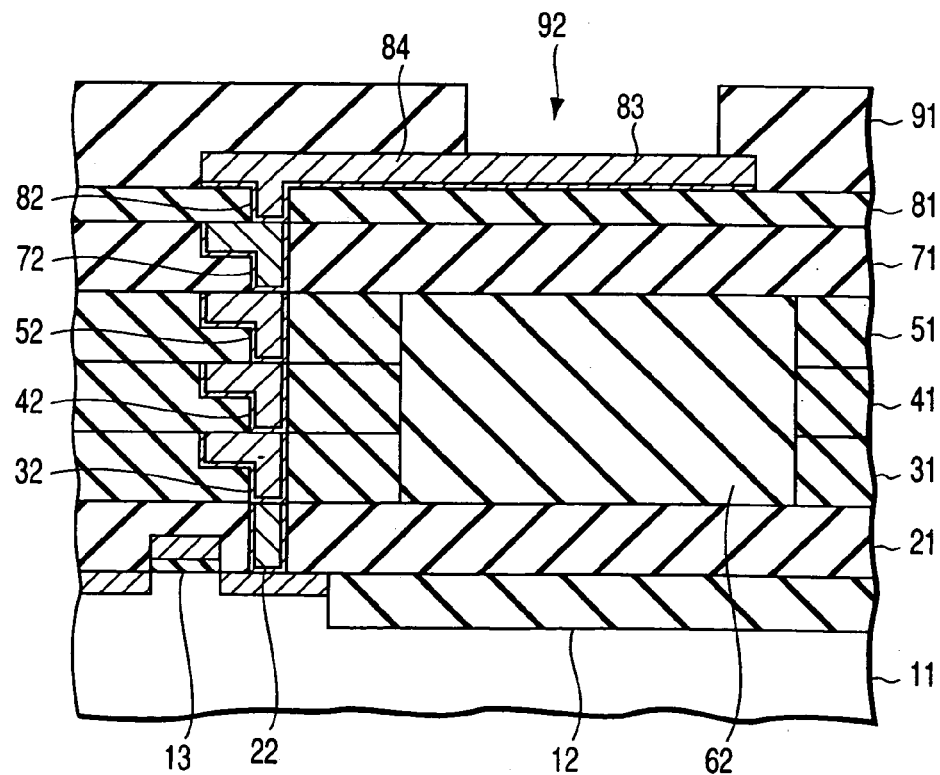
FIG. 2 is a cross-sectional view of a modification of the semiconductor device according to an embodiment of the invention.
Figure 3:
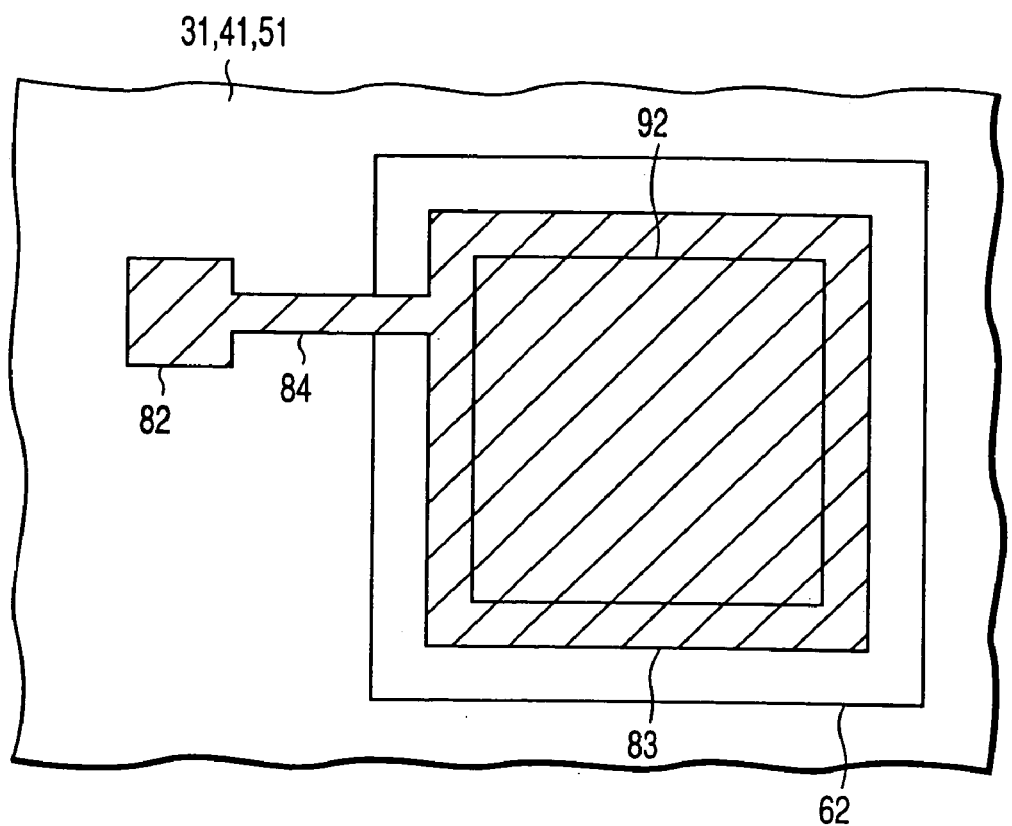
FIG. 3 is a plan view illustrating the positional relation of the patterns of the semiconductor device according to an embodiment of the invention.

FIG. 3 is a plan view illustrating the positional relation of the insulating portion 62, conductive connecting portion 82, pad 83, connecting portion 84 and hole 92, shown in FIG. 1D or FIG. 2. As FIG. 3 depicts, patterns of the interlayer insulating films 31, 41 and 51 are arranged in a region (first region) where a pattern of the insulating portion 62 is not formed. A pattern of the conductive connecting portion 82 is arranged inside the pattern of the films 31, 41 and 51. A pattern of the pad 83 is arranged inside a region (second region) where the pattern of the insulating portion 62 is formed. A pattern of the hole 92 is arranged inside the pattern of the pad 83. That part of the pad 83, which is exposed through the hole 92, serves as actual pad that is to be connected to an external portion. A pattern of the connecting portion 84 that connects the conductive connecting portion 82 to the pad 83 is arranged, extending across the boundary between the pattern of the insulating portion 62, on the one hand, and the patterns of the films 31, 41 and 51, on the other.

Figure 4:
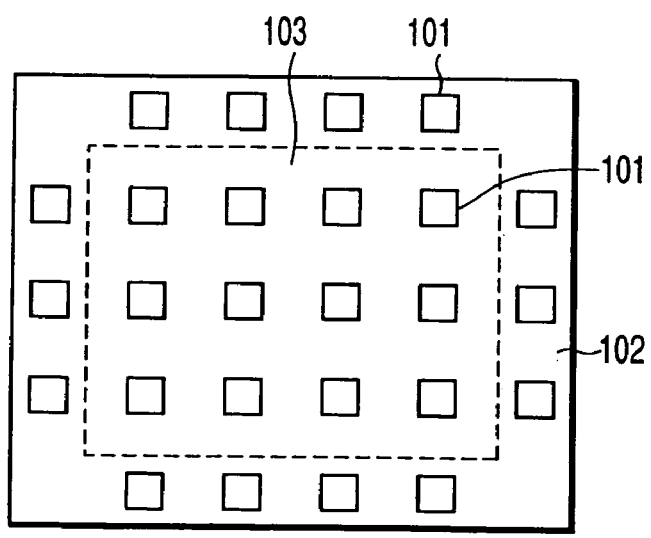
FIG. 4 is a plan view of the entire chip structure of the semiconductor device according to an embodiment of the invention.

FIG. 4 is a plan view of the entire chip structure of the semiconductor device thus manufactured. The region 101 in which the insulating portion 62 is formed may exist in the peripheral region 102 of the chip, in the circuit region 103 inside the peripheral region 102, where the transistor, wires and the like are provided, or in both regions 102 and 103. The insulating portion 62 need not be shaped like an island, which is located right below each of the pads, but the portion 62 may be shaped like a ring in the peripheral region of the chip, corresponding to the pads provided in the peripheral region of the chip.

In the semiconductor device according to the embodiment, the insulating portion (second insulating portion) 62 that lies adjacent to the insulating portion (first insulating portion) composed of the low dielectric-constant interlayer insulating films 31, 41 and 51 having a relative dielectric constant of 3.0 or less is not a low dielectric-constant insulating film as specified above. The insulating film 21 provided on the lower layer side of the insulating portion 62 is not a low dielectric-constant insulating film, either. Of the insulating film provided on the upper layer side of the insulating portion 62, at least the insulating film 71 is not a low dielectric-constant insulating film.

Most low dielectric-constant insulating films having a relative dielectric constant of 3.0 or less are softer and more fragile than ordinary $SiO_2$ films. In the embodiment, the insulating film for the insulating portion 62 or the like is an ordinary $SiO_2$ film that has a relative dielectric constant greater than 3.0, and is harder and stronger than the interlayer insulating films 31, 41 and 51 that are low dielectric-constant insulating films. Hence, the insulating film is hardly deformed or cracked when a pressure is applied to the region below the pad 83 as a test probe contacts the pad to evaluate the characteristic of the transistor 13 or as wire bonding is performed to connect the pad to an external portion. This prevents the reliability and characteristic of the chip element from being degraded.

If the insulating film 81 is an ordinary $SiO_2$ film or the like that has a relative dielectric constant greater than 3.0, the insulating films including the film 81 are prevented from being deformed or cracked, successfully preventing the degradation of the chip element in terms of reliability or characteristic. Even if the insulating film 81 is a low dielectric-constant insulating film having a relative dielectric constant of 3.0 or less, the pressure applied to the pad 83 does not adversely influence the insulating films lying below the insulating film 81, and only the film 81 may be deformed or cracked. This is because the insulating films lying below the film 81 have a relative dielectric constant greater than 3.0. Thus, the region provided below these insulating films and including the chip element would not be degraded.

In the embodiment, a hole 61 is made in the interlayer insulating films 31, 41 and 51 in a single manufacturing step after the conductive connecting portions 32, 42 and 52 have been formed. The insulating portion 62 is then formed in the hole 61. In the method of the embodiment, complicated processes, such as, forming a hole in each of the interlayer insulating films, forming an $SiO_2$ film in each of the holes, forming a pad and a conductive portion in each of the interlayer insulating films, which are applied to the conventional method, are not carried out. Obviously, the method of the embodiment comprises far less steps than the conventional method and can help to enhance the efficiency of manufacturing semiconductor devices.

In the embodiment, the insulating portion 62 is formed in the hole 61 made in the interlayer insulating films 31, 41 and 51. Neither pads nor conductive portions for connecting pads are, therefore, formed in the insulating portion 62. Nevertheless, the conductive connecting portions 32, 42 and 52 are formed in the interlayer insulating films 31, 41 and 51, which lie adjacent to the insulating portion 62, in such a manner that they extend through the films 31, 41 and 51. In addition, the connecting portion 84 is formed, which lies above the region of the insulating portion 62 and the region of the films 31, 41 and 51 and which extends across the boundary between these regions. Hence, the pad 83 can be connected to the chip element (i.e., transistor 13 in the embodiment).

Thus, with the embodiment it is possible to prevent the chip element from being degraded in characteristic or reliability due to the low dielectric-constant insulating film being deformed or cracked. Moreover, the connection of the pad 83 is ensured and the efficiency of manufacturing the semiconductor device can be enhanced.

In the embodiment described above, the low dielectric-constant insulating films are made of poly methyl siloxane (MSX) or poly methyl silsesquioxane (MSQ). Nevertheless, they may be made of parylene-F, benzocyclobutane, a-C:F, fluoropolyimide, PTFE, poly(arylene-ether), aerogel, hydrogen-silsesquioxane, or the like.

In the embodiment, the insulating film 62 and the like are made of $SiO_2$. Nonetheless, they may be made of silicon nitride (SiN). It is sufficient for them to have a relative dielectric constant greater than 3.0 and particularly to be harder and stronger than the low dielectric-constant interlayer insulating films 31, 41 and 51.

Additional advantages and modifications will readily occur to those skilled in the art. Therefore, the invention in its broader aspects is not limited to the specific details and representative embodiments shown and described herein. Accordingly, various modifications may be made without departing from the sprint or scope of the general inventive concept as defined by the appended claims and their equivalents.

The invention claimed is:

1. A method of manufacturing a semiconductor device, comprising:
    stacking a plurality of insulating films each having a relative dielectric constant of at most 3.0 in first and second regions which are provided on a substrate and which are located adjacent to each other in a direction parallel to a major surface of the substrate;
    removing those parts of the plurality of insulating films, which lie in the second region, to make a hole in the plurality of insulating films;
    forming an insulating film having a relative dielectric constant greater than 3.0 in the hole; and
    forming a pad above the insulating film having a relative dielectric constant greater than 3.0; wherein forming the pad includes forming a connecting portion which extends across a boundary between the first and second regions and which electrically connects the pad to a conductive portion formed in the first region, a pattern of the connecting portion having a width smaller than that of a pattern of the pad.

2. The method according to claim 1, wherein stacking the plurality of insulating films includes forming the conductive portion in the plurality of insulating films.

3. The method according to claim 2, further comprising forming, on the substrate, an active element to be electrically connected to the conductive portion before forming the plurality of insulating films.

4. The method according to claim 1, wherein stacking the plurality of insulating films is performed without interposing an insulating film having a relative dielectric constant of at most 3.0, between the substrate and the plurality of insulating films.

5. The method according to claim 2, wherein forming the pad is performed with interposing an insulating film having a relative dielectric constant of at most 3.0, between the pad and the insulating film having a relative dielectric constant greater than 3.0.

* * * * *